(12) United States Patent
Liang et al.

(10) Patent No.: US 8,476,669 B2
(45) Date of Patent: Jul. 2, 2013

(54) LED MODULE AND LED LAMP HAVING THE LED MODULE

(71) Applicant: Lite-On Electronics (Guangzhou) Limited, Guangzhou (CN)

(72) Inventors: Chih-Lung Liang, Taipei (TW); Yan-Yu Wang, Taipei (TW)

(73) Assignees: Lite-On Electronics (Guangzhou) Limited, Guangzhou (CN); Lite-on Technology Corp., Taipei (TW)

( * ) Notice: Subject to any disclaimer, the term of this patent is extended or adjusted under 35 U.S.C. 154(b) by 0 days.

(21) Appl. No.: 13/647,681

(22) Filed: Oct. 9, 2012

(65) Prior Publication Data

US 2013/0032833 A1 Feb. 7, 2013

Related U.S. Application Data

(63) Continuation of application No. 13/074,200, filed on Mar. 29, 2011, now Pat. No. 8,309,978.

(30) Foreign Application Priority Data

May 4, 2010 (CN) .......................... 2010 1 0170011

(51) Int. Cl.
*H01L 33/00* (2010.01)
(52) U.S. Cl.
USPC .. 257/99; 257/88; 257/E33.059; 257/E33.066

(58) Field of Classification Search
USPC ........................ 257/99, 88, E33.059, E33.066
See application file for complete search history.

(56) References Cited

U.S. PATENT DOCUMENTS

2010/0258838 A1* 10/2010 Chiang et al. ................... 257/99
2011/0254024 A1* 10/2011 Chao .............................. 257/88

* cited by examiner

*Primary Examiner* — Kimberly Rizkallah
*Assistant Examiner* — Timor Karimy
(74) *Attorney, Agent, or Firm* — Rosenberg, Klein & Lee

(57) ABSTRACT

An LED module includes a first dielectric layer, and a first patterned conductive layer having first, second, and third die-bonding pads. Each die-bonding pad includes a pad body having a die-bonding area, and an extension extended from the pad body. The extension of the first die-bonding pad extends in proximity to the die-bonding area of the second die-bonding pad. The extension of the second die-bonding pad extends in proximity to the die-bonding area of the third die-bonding cad. A second dielectric layer disposed on the first patterned conductive layer includes three dielectric members corresponding respectively to the die-bonding pads of the first patterned conductive layer. Each dielectric member includes a chip-receiving hole exposing the die-bonding area of a respective die-bonding pad for attachment of an LED chip thereto, and a wire-passage hole spaced apart from the chip-receiving hole to expose partially the first patterned conductive layer for bonding a wire.

10 Claims, 21 Drawing Sheets

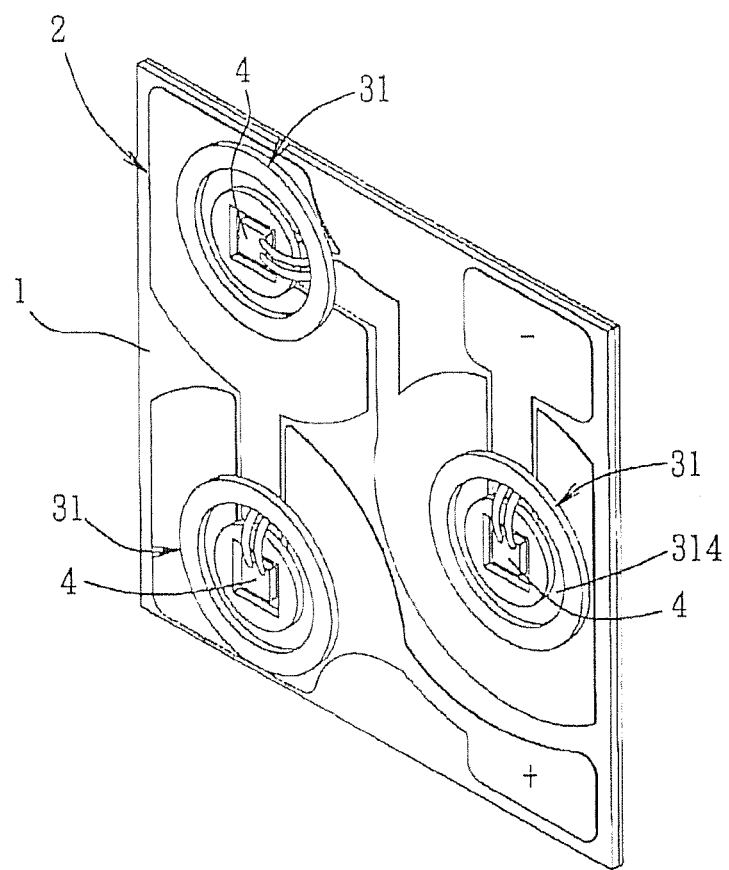
F I G. 5

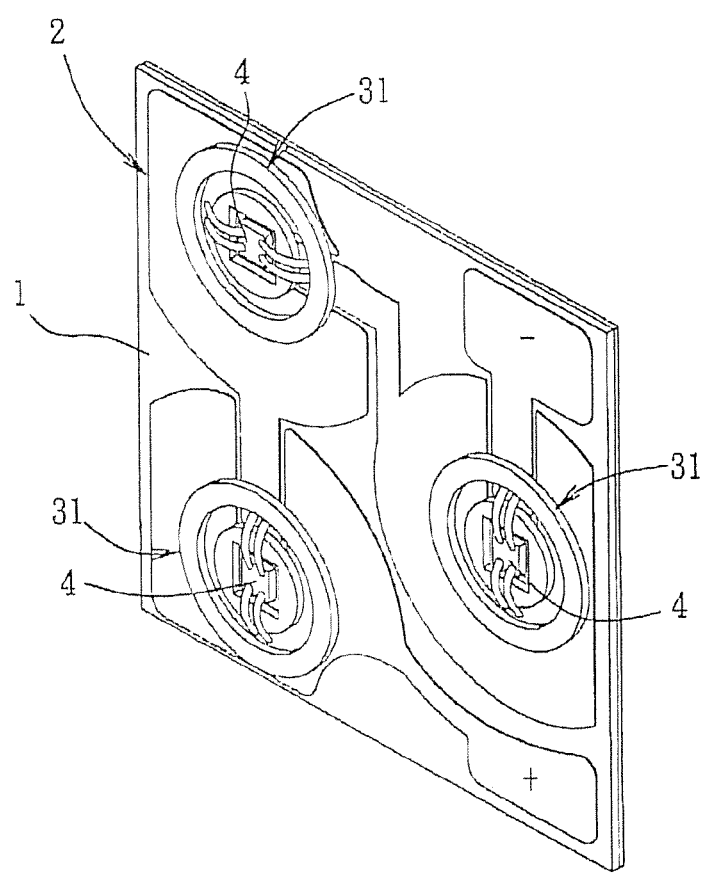
F I G. 6

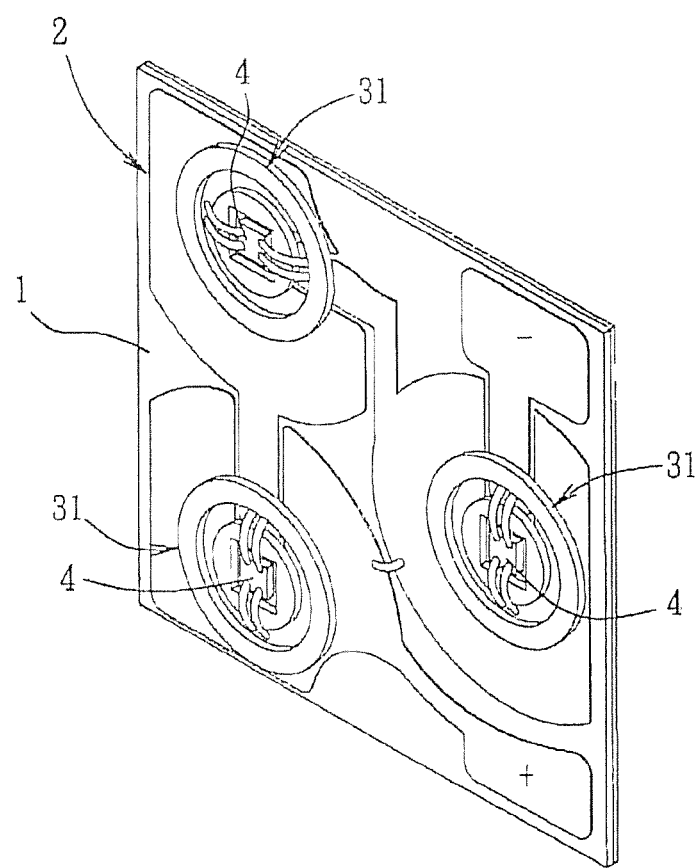
F I G. 7

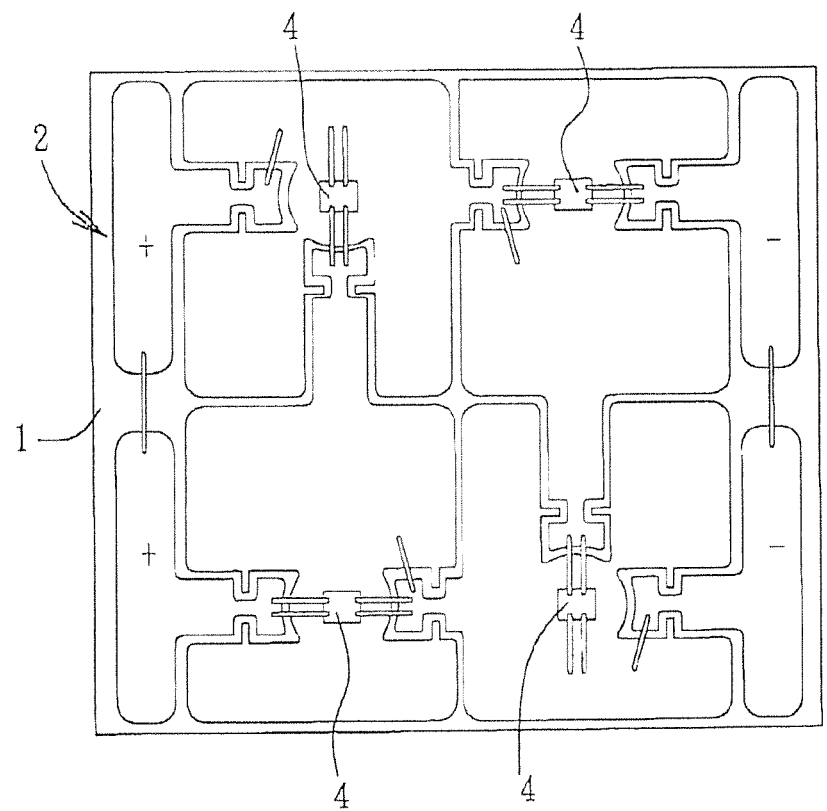
F I G. 13

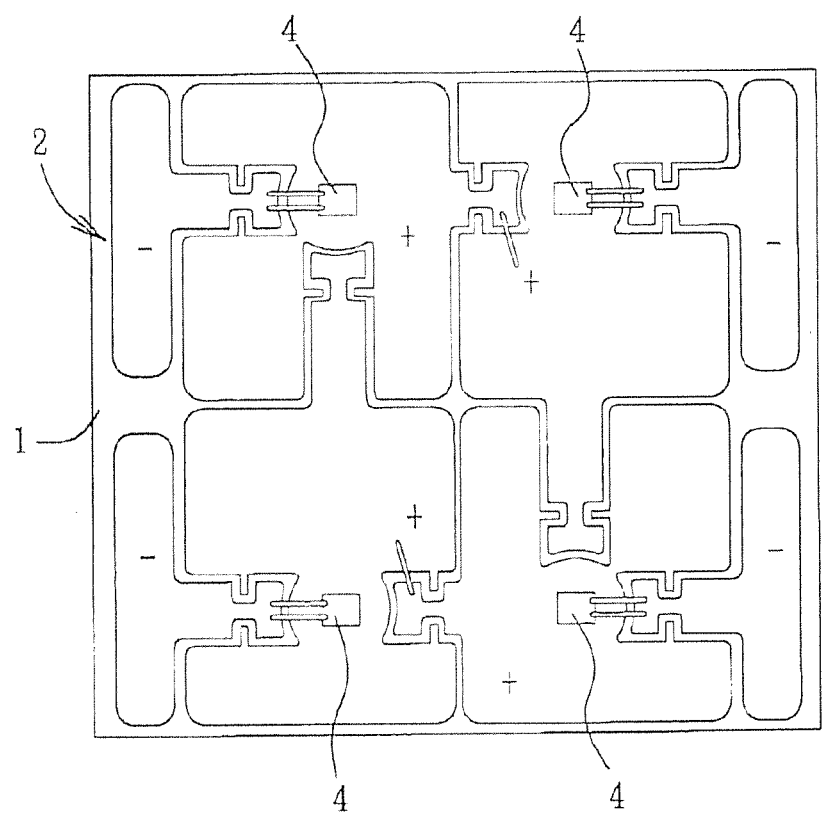
F I G. 14

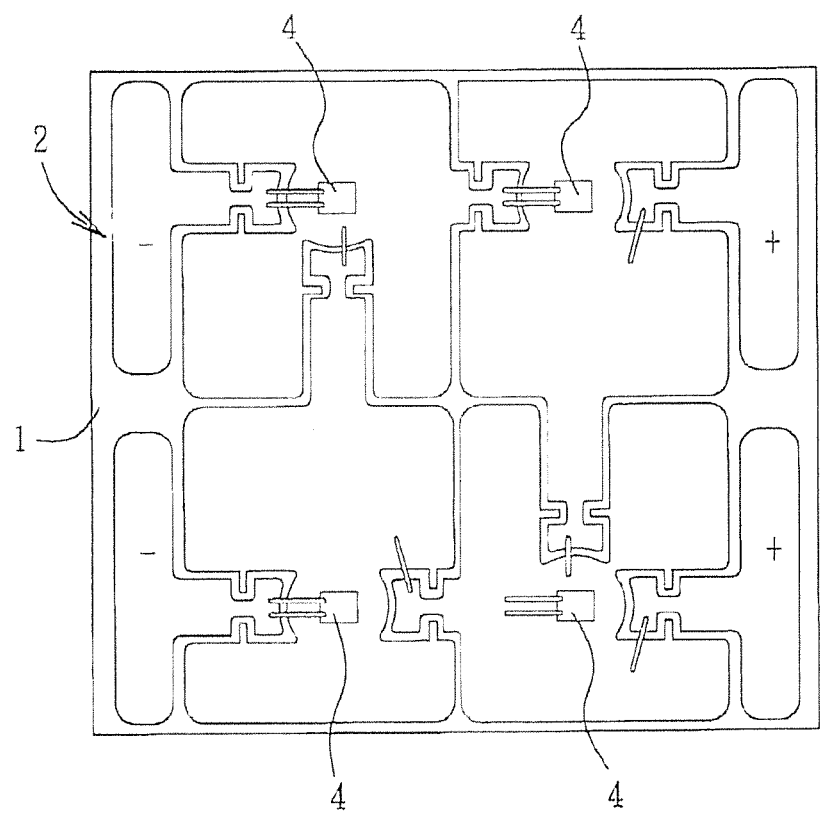
F I G. 15

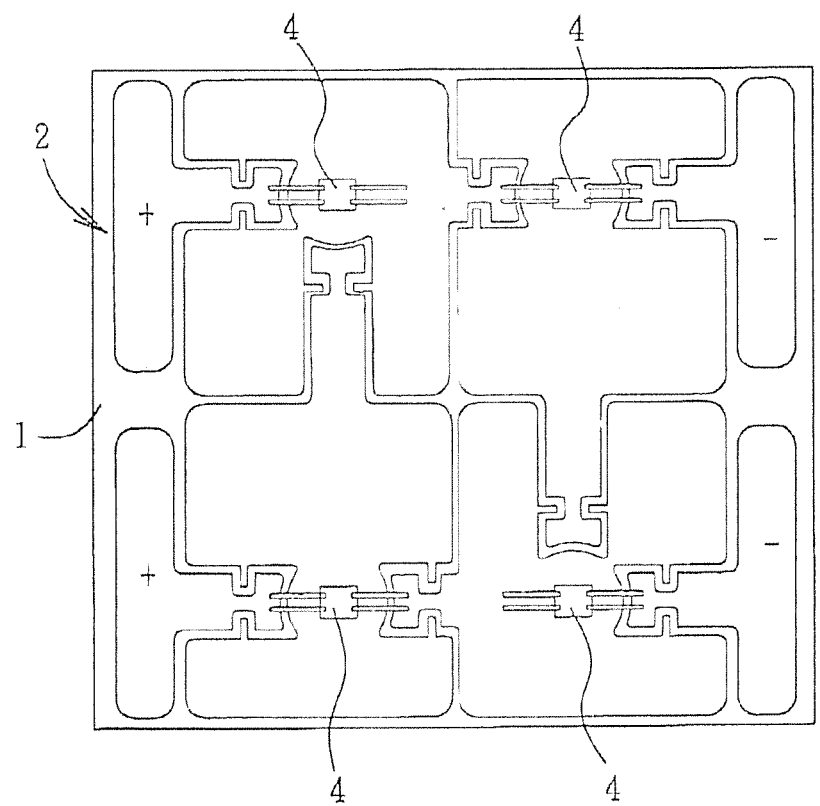
F I G. 16

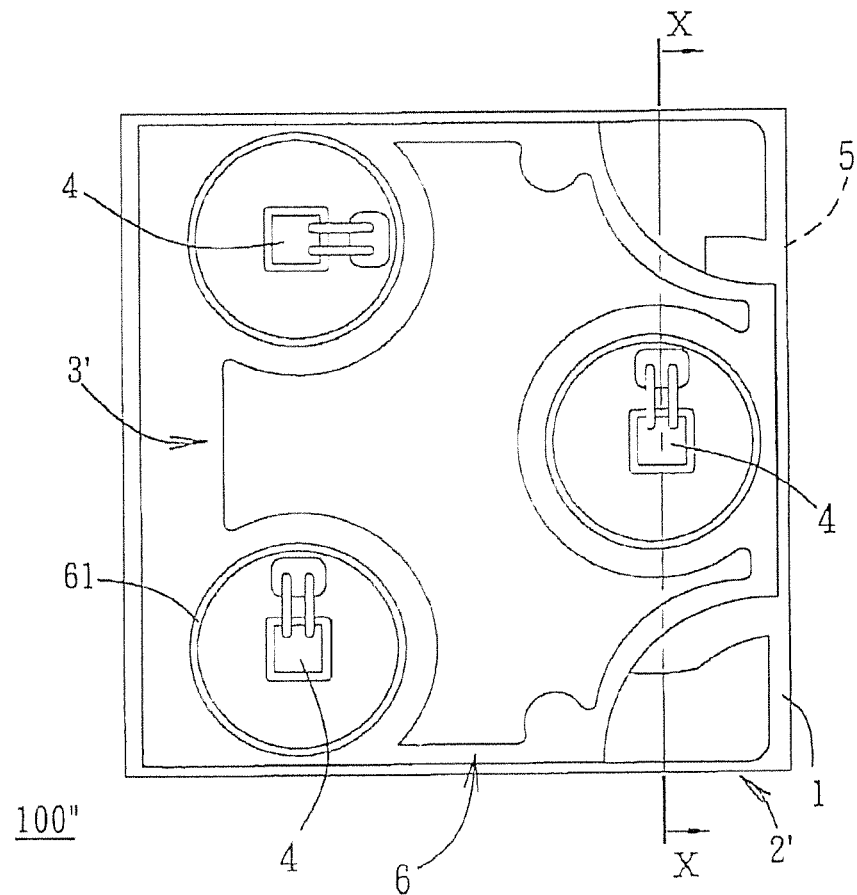
F I G. 18

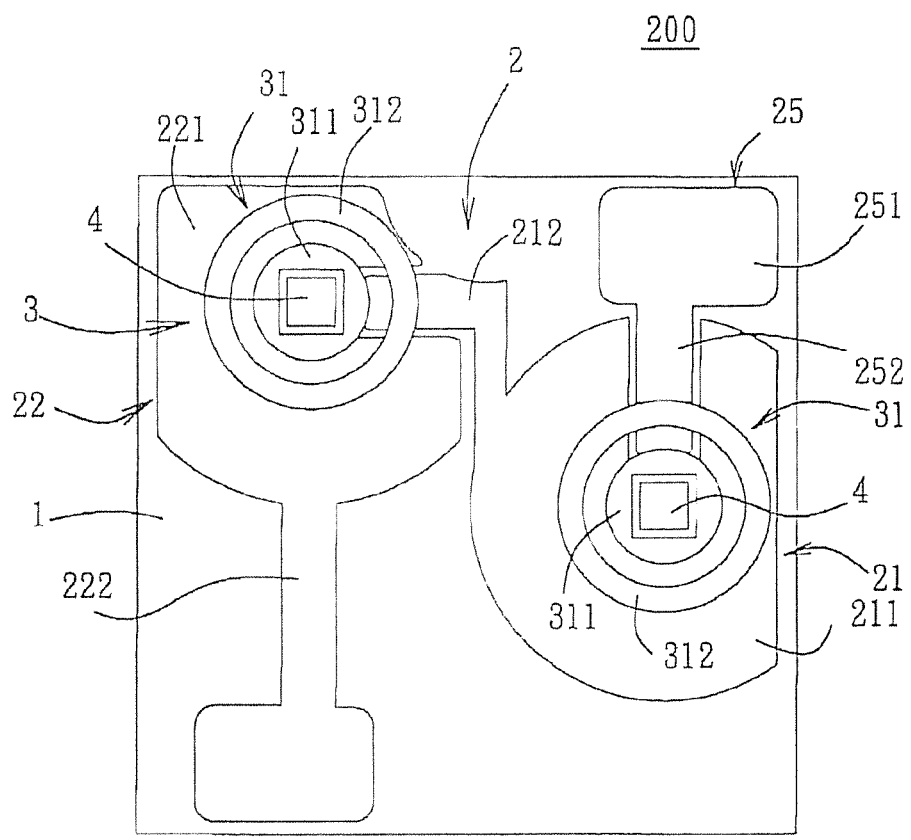
F I G. 20

LED MODULE AND LED LAMP HAVING THE LED MODULE

CROSS-REFERENCE TO RELATED APPLICATION

This Application is being filed as a Continuation Application of U.S. Ser. No. 13/074,200, filed 29 Mar. 2011. currently pending.

BACKGROUND OF TEE INVENTION

1. Field of the Invention

This invention relates to a light emitting diode (LED) module, more particularly to a light emitting diode (LED) module with a chip-on-board (COB) structure and including at least two LED chips and a light emitting diode (LED) lamp having the LED module.

2. Description of the Related Art

Technological progress in Producing light emitting diode (LED) chips has resulted in an increase in the power of the LED chips, and this, in turn, has resulted in an increase in the resulting generated heat. As a consequence, the heat-dissipating effect of an LED package structure becomes an important factor that affects the quality of an LED product. Hence, there are continuous efforts to enhance the heat-dissipating effect of LED package structures. Currently, a package body having a plurality of LED chips is connected to a metal core printed circuit board (MCPCB) by soldering to effect heat-dissipation. The heat-dissipation path thereof includes a plurality of thermal resistant layers that may reduce the effect of heat-dissipation.

Further, the electrode structure of the current LED chip may be vertical or horizontal in type, and the colors emitted by the LED chips are different. There is an ongoing need to enable an increase in flexibility in selecting the types of LED chips in an LED module as well as an increase in a design space for the circuit (series or parallel) between the LED chips within the same module to facilitate later use.

SUMMARY OF THE INVENTION

Therefore, an object of the present invention is to provide a multi-chip LED module that can simultaneously use horizontal and vertical types of chips, that has flexibility for circuit design, and that can enhance the effect of heat dissipation.

According to this invention, an LED module comprises a first dielectric layer, a first patterned conductive layer, and a second dielectric layer. The first patterned conductive layer is disposed on the first dielectric layer, and includes first, second, and third die-bonding pads. Each die-bonding pad includes a pad body, and an extension extended from the pad body. The pad body has a die-bonding area. The extension of the first die-bonding pad extends in proximity to the die-bonding area of the second die-bonding pad, and the extension of the second die-bonding pad extends in proximity to the die-bonding area of the third die-bonding pad. The second dielectric layer is disposed on the first patterned conductive layer, and includes three dielectric members corresponding respectively to the die-bonding pads of the first patterned conductive layer. Each dielectric member includes a chip-receiving hole and a wire-passage hole. The chip-receiving hole exposes the die-bonding area of a respective die-bonding pad for attachment of an LED chip thereto. The wire-passage hole is spaced apart from the chip-receiving hole to expose partially the first patterned conductive layer for bonding a wire.

The efficiency of the LED module of the present invention resides in the fact that through the patterned conductive layer which has a plurality of die-bonding pads, flexibility is provided with respect to the use of the circuit design and the chip type. Further, the dielectric layer and the patterned conductive layer may respectively be a ceramic layer and a copper layer that are soldered to form a multi-layered structure. The LED chip may be directly connected to the patterned conductive layer (Chip-on-Board) to thereby minimize the thermal resistant layers and enhance the effect of heat dissipation. Moreover, the LED module has a chip-receiving hole and a surrounding structure or a ring structure, and can simplify a package process.

BRIEF DESCRIPTION OF THE DRAWINGS

Other features and advantages of the present invention will become apparent in the following detailed description of the preferred embodiments of the invention, with reference to the accompanying drawings, in which:

FIG. 5 is a perspective view of a first variation of the first preferred embodiment;

FIG. 6 is a perspective view of a second variation of the first preferred embodiment;

FIG. 7 is a perspective view of a third variation of the first preferred embodiment;

FIG. 13 is a perspective view of a third variation of the second preferred embodiment;

FIG. 14 is a perspective view of a fourth variation of the second preferred embodiment;

FIG. 15 is a perspective view of a fifth variation of the second preferred embodiment;

FIG. 16 is a perspective view of a sixth variation of the second preferred embodiment;

FIG. 18 is a schematic top view of the third preferred embodiment in an assembled state;

FIG. 20 is a schematic top view of an LED module according to the fourth preferred embodiment of the present invention.

DETAILED DESCRIPTION OF TEE PREFERRED EMBODIMENTS

Figure 1:
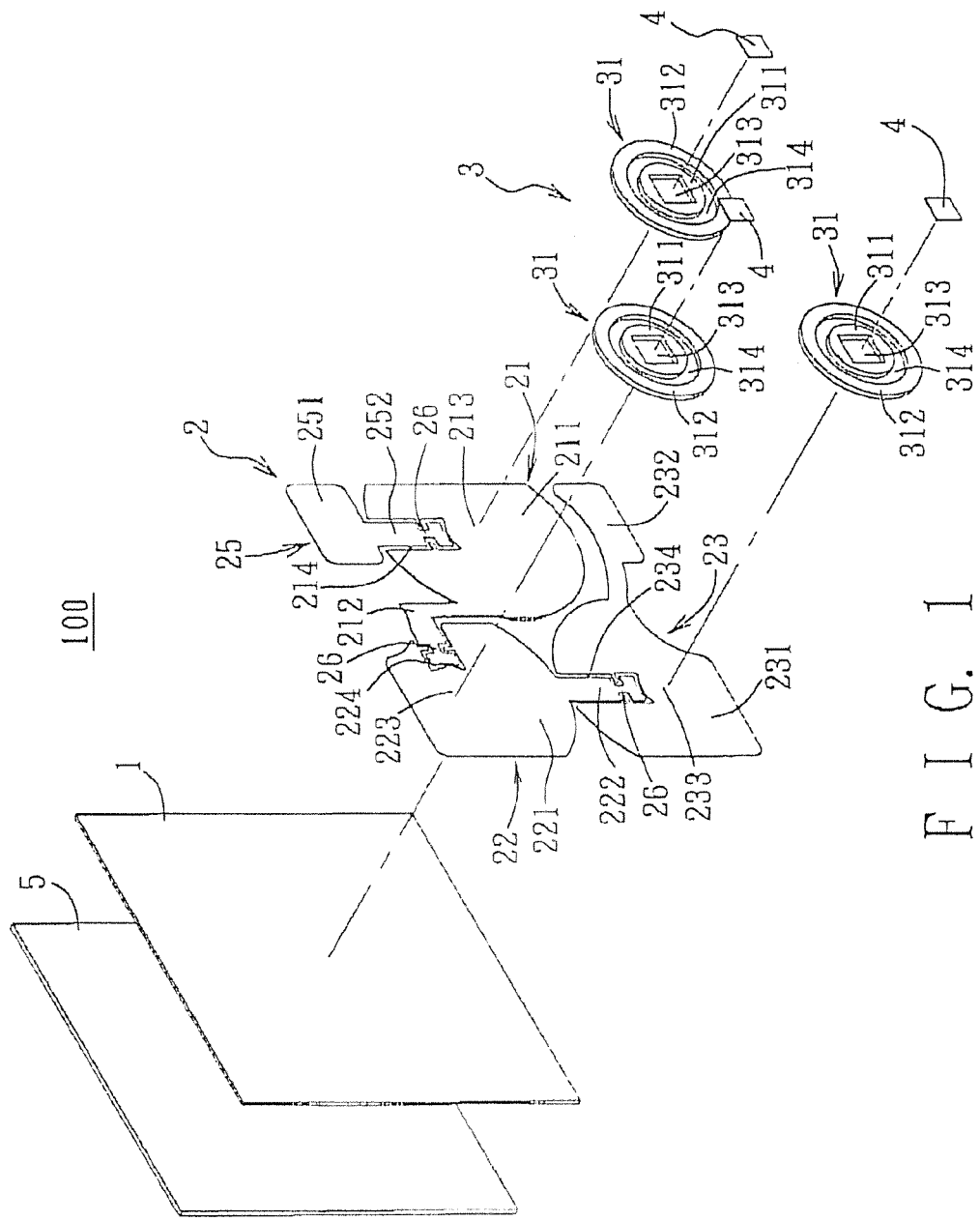
FIG. 1 is an exploded perspective view of an LED module according to the first preferred embodiment of the present invention.

The above-mentioned and other technical contents, features, and effects of this invention will be clearly presented from the following detailed description of five preferred embodiments in coordination with the reference drawings.

Before this invention is described in detail, it should be noted that, in the following description, similar elements are designated by the same reference numerals.

Figure 2:
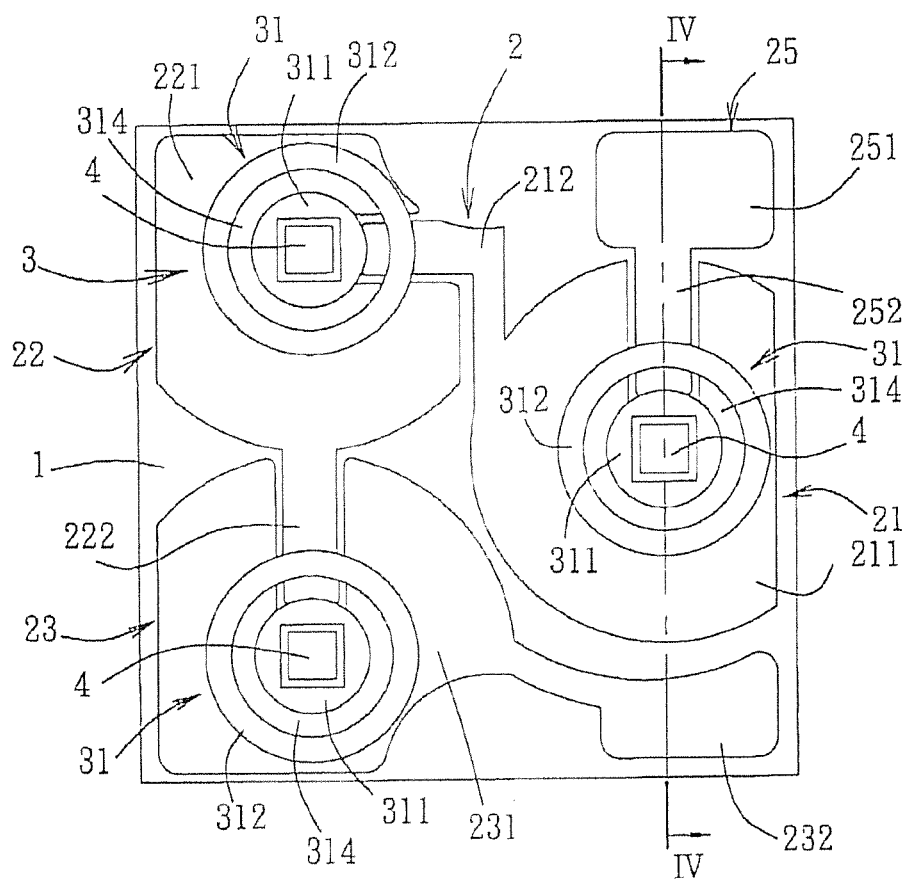
FIG. 2 is a schematic top view of the first preferred embodiment in an assembled state.
Figure 3:
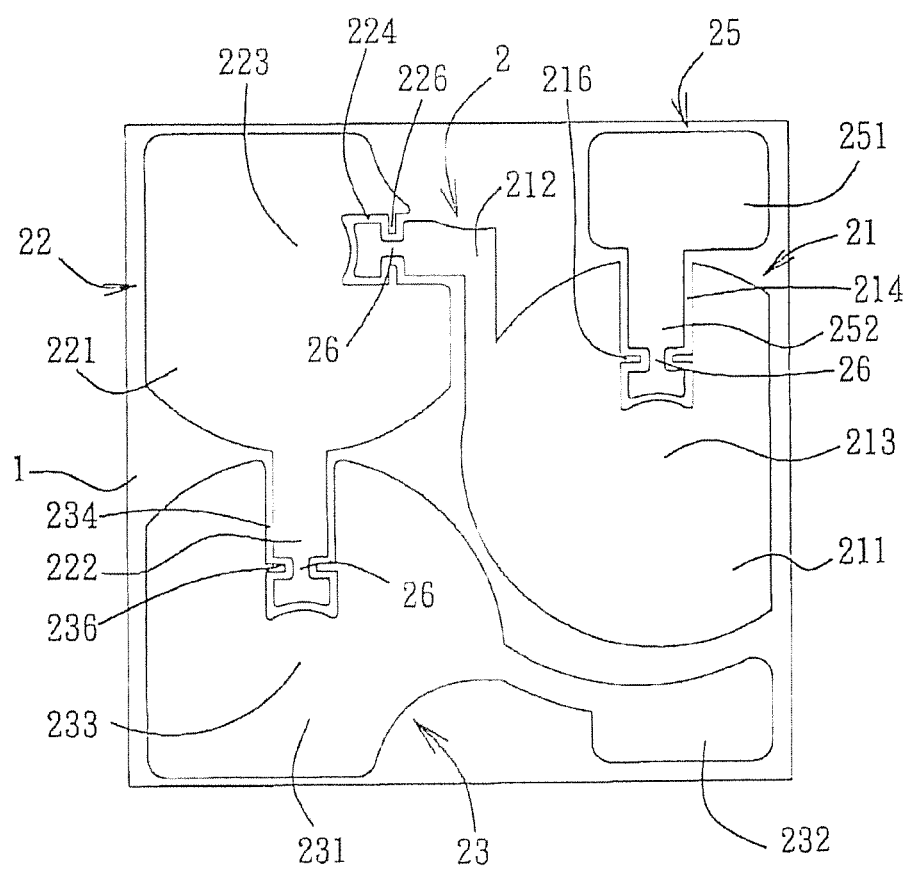
FIG. 3 is a view similar to FIG. 2, but with LED chips and a second dielectric layer removed for clarity's sake.

Referring to FIGS. 1 to 3, an LED module 100 according to the first preferred embodiment of the present invention comprises a first dielectric layer 1, a first patterned conductive layer 2, a second dielectric layer 3, three LED chips 4, and a metallic layer 5 disposed below the first dielectric layer 1.

The first patterned conductive layer 2 is disposed on the first dielectric layer 1, and includes three die-bonding pads 21, 22, 23 arranged in a substantially triangular fashion. The arrangement is such that the first die-bonding pad 21 is located on the right side, the second die-bonding pad 22 is located on the left upper side, and the third die-bonding pad 23 is located on the left lower side. The first die-bonding pad 21 includes a pad body 211, and an extension 212 extended from the pad body 211. The pad body 211 has a die-bonding area 213, and a first cutout 214 extending inwardly from a periphery of the pad body 211 toward the die-banding area 213 thereof. The second die-bonding pad 22 includes a pad body 221, and an extension 222 extended from the pad body 221. The pad body 221 has a die-bonding area 223, and a first cutout 224 extending inwardly from a periphery of the pad body 221 toward the die-bonding area 223 thereof. The third die-bonding pad 23 includes a pad body 231, and an extension 232 extended from the pad body 231. The pad body 231 has a die-bonding area 233, and a first cutout 234 extending inwardly from a periphery of the pad body 231 toward the die-bonding area 233 thereof. The extension 212 of the first die-bonding pad 21 extends into the first cutout 224 of the second die-bonding pad 22 in proximity to the die-bonding area 223 thereof. The extension 222 of the second die-bonding pad 22 extends into the first cutout 234 of the third die-bonding pad 23 in proximity to the die-bonding area 233 thereof.

The first patterned conductive layer 2 further includes a conductive pad 25 disposed on the first dielectric layer 1, and has a conductive body 251, and an extension 252 extended from the conductive body 251 into the first cutout 214 of the first die-bonding pad 21 in proximity to the die-bonding area 213 thereof. In this embodiment, the first patterned conductive layer 2 is formed by etching partially a metal layer such that each of the die-bonding pads 21, 22, 23 and the conductive pad 25 are not in electrical contact with each other. Hence, a large area of the metal layer may be retained to enhance the effect of heat dissipation. A definite gap is formed between each of the extensions 252, 212, 222 and a corresponding one of the first cutouts 214, 224, 234 to prevent electrical connection therebetween.

Figure 4:
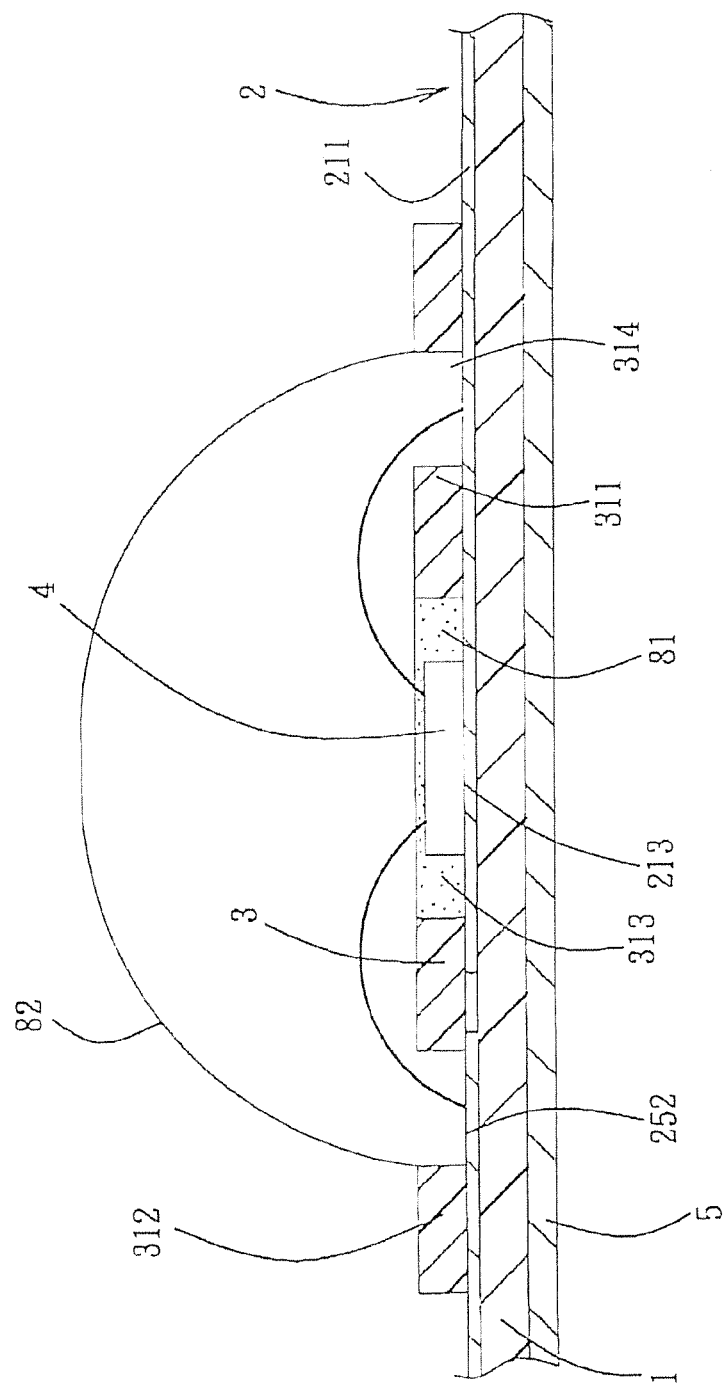
FIG. 4 is a fragmentary sectional view of the first preferred embodiment taken along line IV-IV of FIG. 2.

FIG. 4 is a partial sectional view of the LED module 100 further including an encapsulant 61 made of fluorescent glue, and a lens 82.

With reference to FIGS. 1, 2, and 4, the second dielectric layer 3 is disposed on the first patterned conductive layer 2, and includes three dielectric members 31 disposed respectively on the first to third die-bonding pads 21, 22, 23. Each dielectric member 31 includes a chip-receiving structure 311, and a surrounding structure 312 spaced apart from and surrounding the chip-receiving structure 311. The chip-receiving structure 311 defines a rectangular chip-receiving hole 313 extending through the second dielectric layer 3 and exposing the die-bonding area 213, 223, 233 of the respective die-bonding pad 21, 22, 23 to receive one of the LED chips 4. The chip-receiving structure 311 and the surrounding structure 312 cooperatively define therebetween a wire-passage hole 314 that is spaced apart from the chin-receiving hole 313 and that exposes partially the first patterned conductive layer 2 for a wire bonding process. The wire-passage hole 314 in each dielectric member 31 exposes a portion of the pad body 211, 221, 231 of the respective die-bonding pad 21, 22, 23 that is adjacent to the die-bonding area 213, 223, 233 thereof and a portion of the extension 252, 212, 222 of a corresponding one of the conductive pad 25 and the first and second die-bonding pads 21, 22 that is proximate to the die-bonding area 213, 223, 233 of the corresponding one of the first to third die-bonding pads 21, 22, 23. In this embodiment, the chip-receiving structure 311 is configured as a plate body having a circular outer periphery, and the surrounding structure 312 is annular. Hence, the wire-passage hole 314 defined by the surrounding structure 312 and the chip-receiving structure 311, in this embodiment, is circular. It should be noted that the shape of the wire-passage hole 314 is not limited to being circular, and maybe other geometric shapes, such as a triangle, a square, or a polygon.

Each LED chip 4 is attached to the die-bonding area 213, 223, 233 of the respective die-bonding pad 21, 22, 23 after passing through the chip-receiving hole 313 in the respective dielectric member 31, and is located within the chip-receiving structure 311. The chip-receiving hole structure 311 of each dielectric member 31 and a respective one of the first to third die-bonding pads 21, 22, 23 cooperatively define a receiving groove for receiving one of the LED chips 4 and simultaneously define an area for receiving the encapsulant 81. That is, the encapsulant 81 is located within the chip-receiving hole 311, and covers the LED chip 4. The annular surrounding structure 312 can be used to fill a packaging resin, which can be formed into the lens 82 after being cured. Further, the lens 82 may be preformed and then bonded to a top side of the surrounding structure 312 using glue. Moreover, the lens 82 may also be disposed within the wire-passage hole 314, and a peripheral end of the lens 82 may abut against an inner side of the surrounding structure 312 due to tension, so that subsequent bonding of wires will not be affected.

Referring once again to FIGS. 2 and 3, each of the extensions 212, 222, 252 of the first and second die-bonding pads 21, 22 and the conductive pad 25 has a constriction part 26 stacked below the surrounding structure 312 of the corresponding dielectric member 31. The pad body 211, 221, 231 of each of the first to third die-bonding pads 21, 22, 23 further has a pair of retainers 216, 226, 236 projecting into two opposite sides of the constriction part 26 of the extension 212, 222, 252 of the corresponding one of the first and second die-bonding pads 21, 22 and the conductive pad 25. Through coordination of each pair of the retainers 216, 226, 236 and the corresponding constriction part 26, during filling of the packaging resin, the packaging resin in an uncured state can be prevented from overflowing through two opposite sides of the corresponding extension 212, 222, or 252.

In this embodiment, each of the first and second dielectric layers 1, 3 is made of a ceramic material, and each of the first patterned conductive layer 2 and the metallic layer 5 is made of copper. The metallic layer 5, the first dielectric layer 1, the first patterned conductive layer 2, and the second dielectric layer 3 are directly connected to each other by heat treatment (e.g., soldering) to reduce thermal resistant layers. Further, the LED chips 4 are directly attached to the first patterned conductive layer 2 (Chip-on-Board). Heat generated by the LED chips 4 can be quickly dissipated through the first patterned conductive layer 2, the first dielectric layer 1, and the metallic layer 5, thereby enhancing the effect of heat dissipation. The metallic layer 5, aside from increasing the speed of heat dissipation, can also facilitate installation of the LED module 100 on a subsequent applied product using a reflow process. Alternatively, the metallic layer 5 may be dispensed herewith, and will not affect the basic function of the LED module 100. Hence, through soldering of the ceramic and copper layers to form a multi-layer structure, a smooth die-bonding flat surface may be obtained, and the chip-receiving hole 313 for filling of the fluorescent glue and the surrounding structure 312 for filling of the packaging resin may be formed directly, thereby simplifying the packaging process.

The LED module 100 is very flexible with respect to the selective use of horizontal or vertical type of LED chips and with respect to the design of the circuit. Three implementations of the first preferred embodiment are shown in FIGS. 5 to 7. It should be noted that the variations in the circuit are illustrated only with the first patterned conductive layer 2 and the LED chips 4 thereafter. Further, the bottom electrode of a vertical type LED chip is directly connected to the first patterned conductive layer 2, and the top electrode is connected electrically to the first patterned conductive layer 2 by a wire-bonding process. The two electrodes of a horizontal type LED chip are connected electrically to the first patterned conductive layer 2 by a wire-bonding process.

With reference to FIG. 5, the LED chips 4 used in the first implementation of the first preferred embodiment are vertical type LED chips which are connected electrically in series.

With reference to FIG. 6, the LED chips 4 used in the second implementation of the first preferred embodiment are horizontal type LED chips which are connected electrically in series.

With reference to FIG. 7, the LED chips 4 used in the third implementation of the first preferred embodiment are horizontal type LED chips which are connected electrically in parallel.

Figure 8:
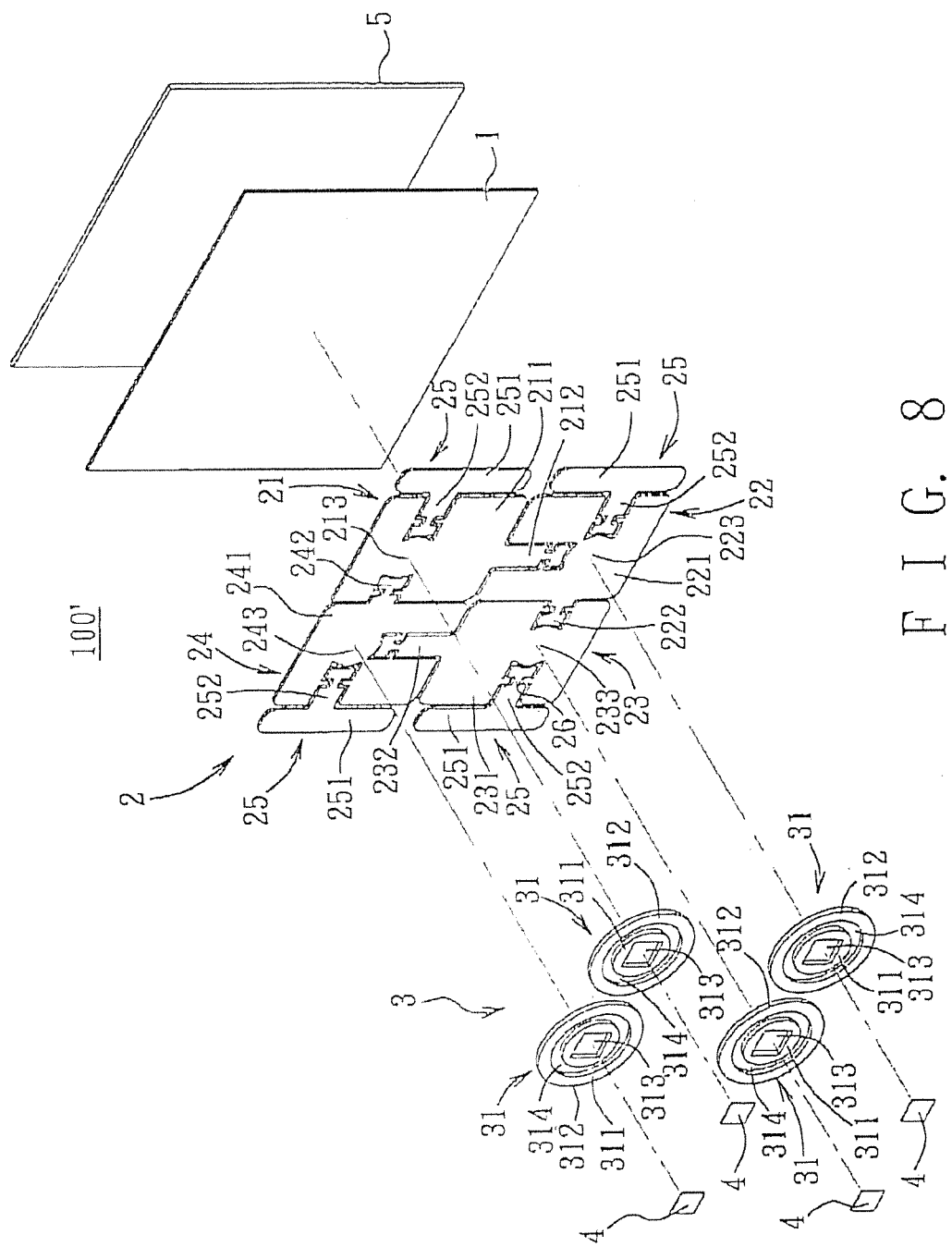
FIG. 8 is an exploded perspective view of an LED module according to the second preferred embodiment of the present invention.
Figure 9:
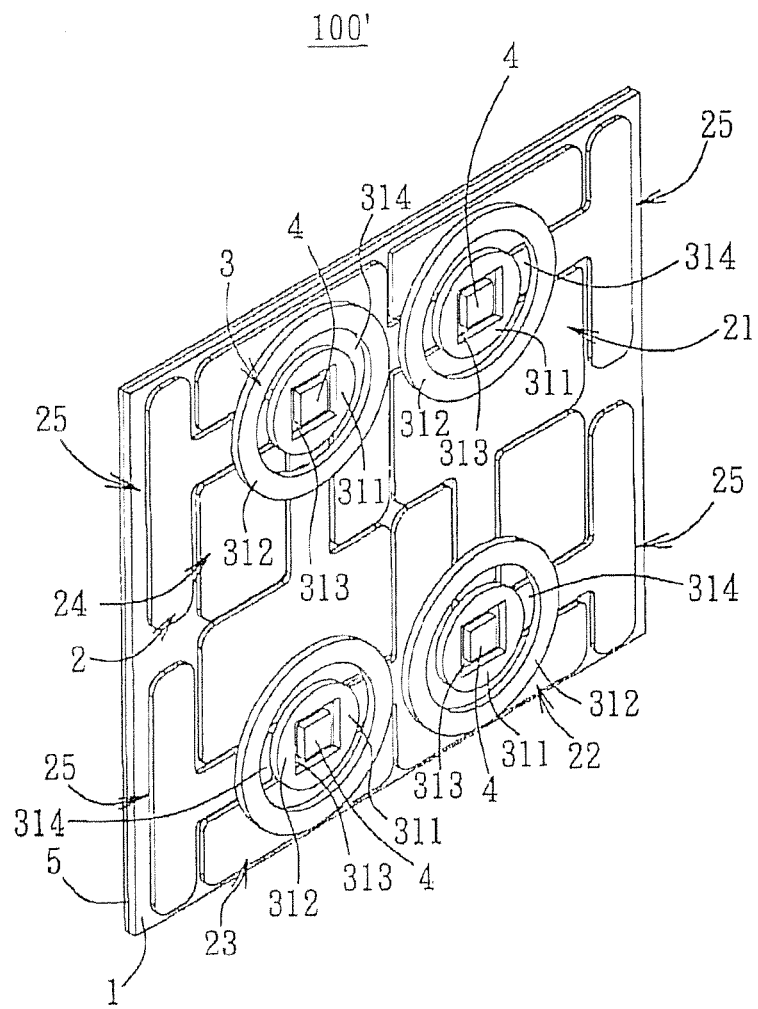
FIG. 9 is a perspective view of the second preferred embodiment in an assembled state.
Figure 10:
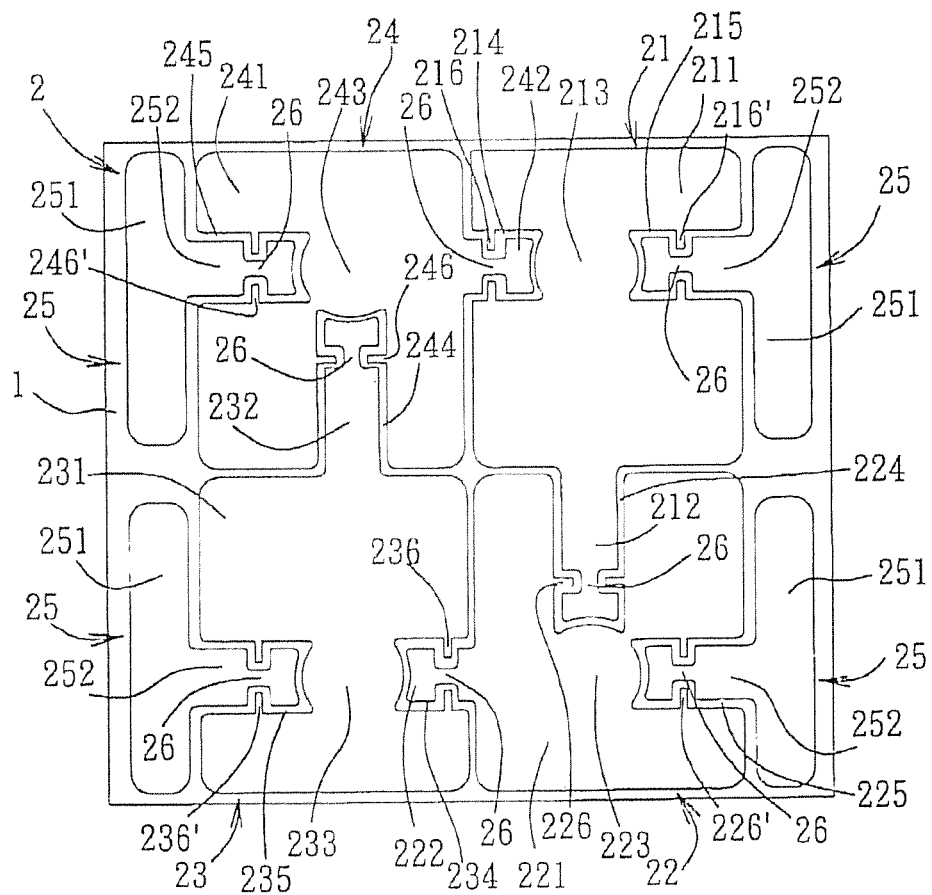
FIG. 10 is a schematic top view of the second preferred embodiment, but with LED chips and a second dielectric layer removed for clarity's sake.

Referring to FIGS. 8 to 10, an LED module 100' according to the second preferred embodiment of the present invention is shown to be similar to the first preferred embodiment. Particularly, the LED module 100' comprises a first dielectric layer 1, a first patterned conductive layer 2, a second dielectric layer 3, and a metallic layer 5 disposed below the first dielectric layer 1. However, in this embodiment, the LED module 100' comprises four LED chips 4, the first patterned conductive layer 2 includes four die-bonding pads 21, 22, 23, 24 and four conductive pads 25, and the second dielectric layer 3 includes four dielectric members 31 disposed respectively on the die-bonding pads 21, 22, 23, 24.

The four die-bonding pads 21, 22, 23, 24 are arranged in a rectangular fashion on the first dielectric layer 1. The arrangement is such that the first die-bonding pad 21 is located on the right upper side, the second die-bonding pad 22 is located on the right lower side, the third die-bonding pad 23 is located on the left lower side, and the fourth die-bonding pad 24 is located on the left upper side. The pad body 211, 221, 231, 241 of each of the first to fourth die-bonding pads 21, 22, 23, 24 further includes a second cutout 215, 225, 235, 245 extending inwardly from the periphery of the respective pad body 211, 221, 231, 241 toward the die-bonding area 213, 223, 233, 243 thereof and spaced apart from the first cutout 214; 224, 234, 244. The extension 232 of the third die-bonding pad 23 extends into the first cutout 244 of the fourth die-bonding pad 24 in proximity to the die-bonding area 243 thereof. The extension 242 of the fourth die-bonding pad 24 extends into the first cutout 214 of the first die-bonding pad 21 in proximity to the die-bonding area 213 thereof.

The extension 252 of each conductive pad 25 extends into the second cutout 215, 225, 235, 245 of a respective one of the first to fourth die-bonding pads 21, 22, 23, 24 in proximity to the die-bonding area 213, 223, 233, 243 thereof.

The structure of each dielectric member 31 is similar to that described in the first preferred embodiment. Particularly, each dielectric member 31 includes a chip-receiving structure 311, and a surrounding structure 312 spaced apart from and surrounding the chip-receiving structure 311. The chip-receiving structure 311 of each dielectric member 31 defines a rectangular chip-receiving hole 313 extending through the second dielectric layer 3 and exposing the die-bonding area 213, 223, 233, 243 of the respective die-bonding pad 21, 22, 23, 24. The wire-passage hole 314 defined by the chin-receiving structure 311 and the surrounding structure 312 of each dielectric member 31 is annular, and exposes partially the pad body 211, 221, 231, 241 of the respective die-bonding pad 21, 22, 23, 24, the extension 252 of one of the conductive pads 25, and the extension 212, 222, 232, 242 of the respective die-bonding pad 21, 22, 23, 24.

Each LED chip 4 is attached to the die-bonding area 213, 223, 233, 243 of the respective die-bonding pad 21, 22, 23, 24 after passing through the chin-receiving hole 313 in the respective dielectric member 31, and is located within the chip-receiving structure 311.

Each of the extensions 212, 222, 232, 242, 252 has a constriction part 26. The constriction part 26 of one of the conductive pads 25 and the constriction part 26 of the respective one of the first to fourth die-bonding pads 21, 22, 23, 24 are stacked below the surrounding structure 312 of the respective dielectric member 31. Each of the pad bodies 211, 221, 231, 241 further has a pair of first retainers 216, 226, 236, 246 projecting into the constriction part 26 of the extension 212, 222, 232, 242 of the respective die-bonding pad 21, 22, 23, 24, and a pair of second retainers 216', 226', 236', 246' projecting into the constriction part 26 of the extension 252 of the respective conductive pad 25.

Similarly, each of the first and second dielectric layers 1, 3 is made of a ceramic material, and each of the first patterned conductive layer 2 and the metallic layer 5 is made of copper. The metallic layer 5, the first dielectric layer 1, the first patterned conductive layer 2, and the second dielectric layer 3 are directly connected to each other by heat treatment (e.g., soldering) to reduce thermal resistant layers. Further, the LED chips 9 are directly attached to the first patterned conductive layer 2 (Chip-on-Board). Heat generated by the LED chips 4 can be quickly dissipated through the first patterned conductive layer 2, the first dielectric layer 1, and the metallic layer 5, thereby enhancing the effect of heat dissipation. Similarly, the metallic layer 5 may be optionally used Moreover, the function of the dielectric members 31 and the function of each pair of the first and second retainers 216, 226, 236, 246, 216', 226', 236', 246' with the constriction part 26 of the extension 212, 222, 232, 242, 252 of the corresponding one of the first to fourth die-bonding pads 21, 22, 23, 24 and the conductive pads 25 are similar to that described in the first preferred embodiment.

The LED module 100' is more flexible with respect to the selective use of horizontal or vertical type of LED chips and with respect to the design of the circuit, as compared to that of the first preferred embodiment. Six implementations of the second preferred embodiment are shown in FIGS. 11 to 16. To facilitate the description, the second dielectric layer 3 is not shown in FIGS. 11 to 16, and the variations in the circuit 4 are illustrated only with the first patterned conductive layer 2 and the LED chips 4 thereafter. Similarly, the bottom electrode of the vertical type LED chip is directly connected to the first patterned conductive layer 2, and the top electrode thereof is connected electrically to the first patterned conductive layer 2 by a wire-bonding process. The two electrodes of the horizontal type LED chip are connected electrically to the first patterned conductive layer 2 by a wire-bonding process.

Figure 11:
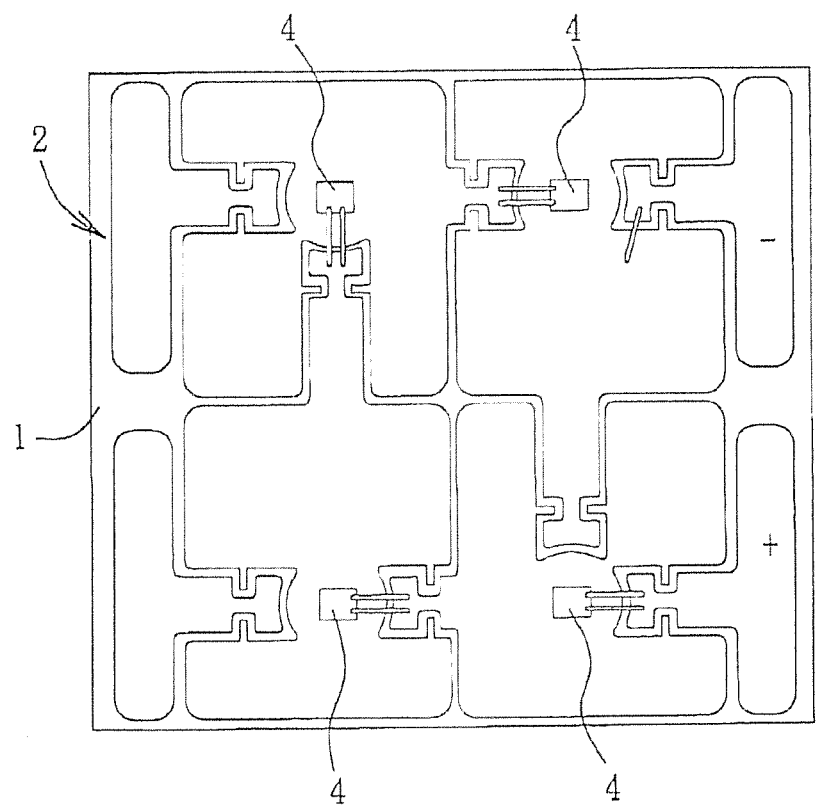
FIG. 11 is a perspective view of a first variation of the second preferred embodiment.

With reference to FIG. 11, the LED chips 4 used in the first implementation of the second preferred embodiment are vertical type LED chins which are connected electrically in series.

Figure 12:
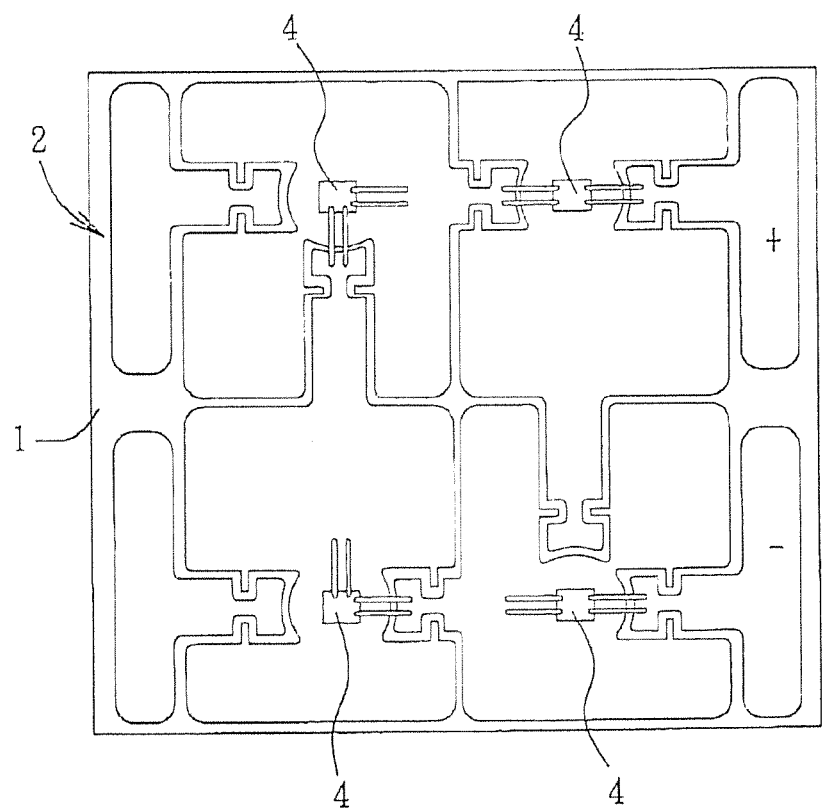
FIG. 12 is a perspective view of a second variation of the second preferred embodiment.

With reference to FIG. 12, the LED chips 4 used in the second implementation of the second preferred embodiment are horizontal type LED chips which are connected electrically in series.

With reference to FIG. 13, the LED chips 4 used in the third implementation of the second preferred embodiment are horizontal type LED chips which are connected electrically in parallel.

With reference to FIG. 14, the LED chips 4 used in the fourth implementation of the second preferred embodiment are vertical type LED chips which are connected electrically in parallel.

With reference to FIG. 15, the LED chips 4 used in the fifth implementation of the second preferred embodiment are vertical type LED chips. Two of the LED chips 4 are connected electrically in series, while the other two of the LED chips 4 are connected electrically in parallel.

With reference to FIG. 16, the LED chips 4 used in the sixth implementation of the second preferred embodiment are horizontal type LED chips. Two of the LED chips 4 are connected electrically in series, while the other two of the LED chips 4 are connected electrically in parallel.

Figure 17:
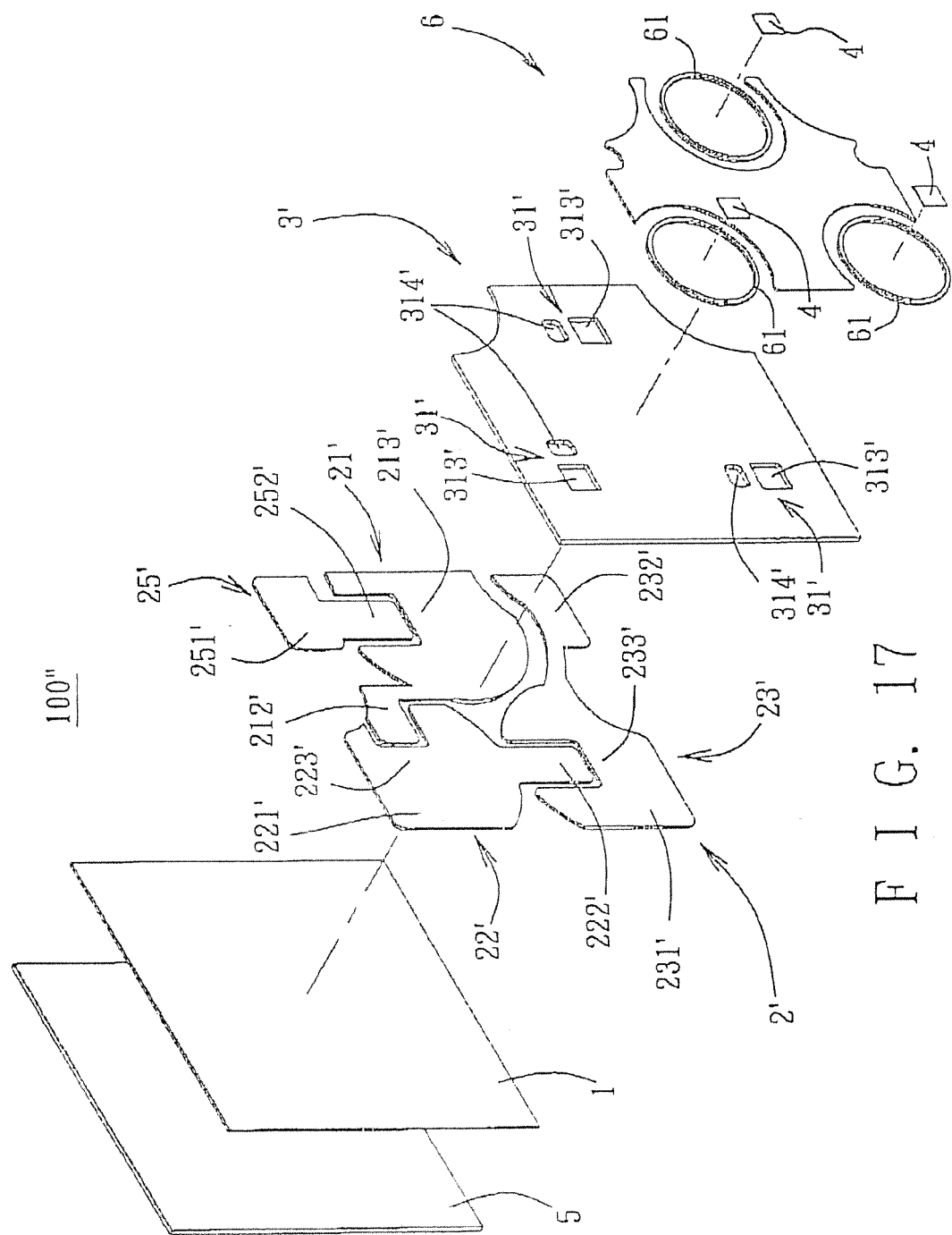
FIG. 17 is an exploded perspective view of an LED module according to the third preferred embodiment of the present invention.
Figure 19:
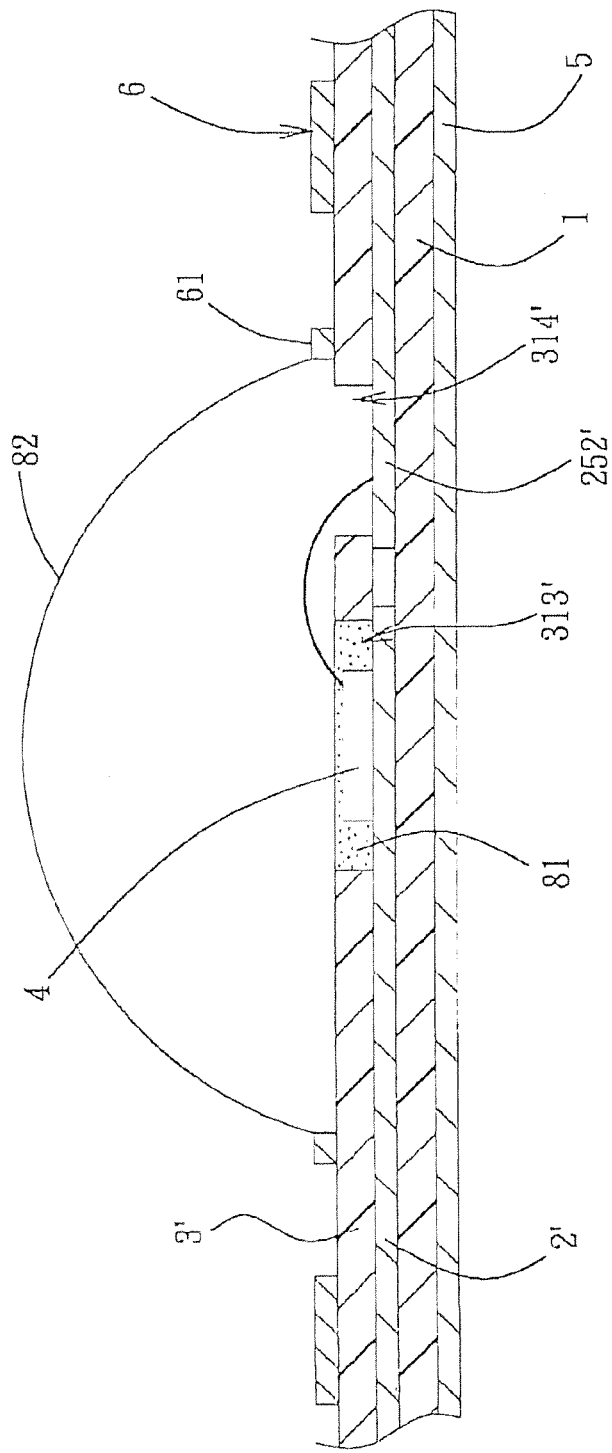
FIG. 19 is a fragmentary sectional view of the third preferred embodiment taken along line X-X of FIG. 18.

Referring to FIGS. 17 to 19, an LED module 100" according to the third preferred embodiment of the present invention is shown to be similar to the first preferred embodiment. However, in this embodiment, the LED module 100" further comprises a second patterned conductive layer 6 disposed on the second dielectric layer 3', and the dielectric members 31' of the second dielectric layer 3' are connected integrally to each other to form a one-piece second dielectric layer 3'.

The structure of the first patterned conductive layer 2' is similar to that described in the first preferred embodiment. However, in this embodiment, the constriction part 26 of the extension 252, 212, 222 of each of the conductive pad 25 and the first and second die-bonding pads 21, 22 and the pair of the retainers 216, 226, 236 of each die-bonding pad 21, 22, 23 shown in FIG. 3 are dispensed herewith.

Unlike the first preferred embodiment, the wire-passage hole 314' in each dielectric member 31' exposes only a portion of the extension 252', 212', 222' of a corresponding one of the conductive pad 25' and the first and second die-bonding pad 21', 22'.

The second patterned conductive layer 6 includes three ring structures 61 disposed on the second dielectric layer 3' corresponding in position to the dielectric members 31' Each ring structure 61 surrounds the chip-receiving hole 313' and the wire-passage hole 314' in a respective dielectric member 31'.

The LED chips 4 are attached respectively to the die-bonding areas 213', 223', 233' of the die-bonding pads 21', 22', 23', and are disposed respectively in the chip-receiving hole 313' in the dielectric members 31'.

Similarly, each of the first and second dielectric members 1, 3' is made of a ceramic material, and each of the first and second patterned conductive layers 2', 6 and the metallic layer 5 is made of copper. The metallic layer 5, the first dielectric layer 1, the first patterned conductive layer 2', the second dielectric layer 3', and the second patterned conductive layer 6 are directly connected to each other by heat treatment (e.g., soldering) to reduce thermal resistance layers. Further, the LED chips 4 are directly attached to the first patterned conductive layer 2' (Chip-on-Board). Heat generated by the LED chips 4 can be quickly dissipated through the first patterned conductive layer 2', the first dielectric layer 1, and the metallic layer 5, thereby enhancing the effect of heat dissipation. The metallic layer 5 is disposed optionally. The function of the chip-receiving hole 313' is similar to that described for the chip-receiving hole 313 of the first preferred embodiment, and is used for filling of the fluorescent glue for forming the encapsulant 81 (see FIG. 19). The ring structure 61 is similar to the surrounding structure 312 of the first preferred embodiment, and is used for filling of a packaging resin for forming the lens 82 (see FIG. 19), or directly disposing a preformed lens 82 onto a top or inner side of the surrounding structure 312.

Referring back to FIG. 18, in this embodiment, the LED chips 4 may be vertical type LED chips which are connected electrically in series. Alternatively, each dielectric member 31' maybe further provided with another wire-passage hole similar to the wire-passage hole 314' shown in FIG. 17 for partial exposure of the pad body 211', 221', 231' of the respective die-bonding pad 21', 22',23' to facilitate a wire-bonding process. Through such a provision, not only the vertical type LED chips can be used in this embodiment, but also horizontal type LED chips or a combination of the vertical type and horizontal type LED chips maybe suitably used in this embodiment.

Referring to FIG. 20, an LED module 200 according to the fourth preferred embodiment of the present invention is shown to be similar to the first preferred embodiment. However, in this embodiment, the first patterned conductive layer 2 includes two die-bonding pads 21, 22, and the second dielectric layer 3 includes two dielectric members 31 corresponding to the die-bonding pads 21, 22. That is, in this embodiment, aside from dispensing with the third die-bonding pad and the corresponding dielectric member, the structure of the LED module 200 is similar to that described in the first preferred embodiment.

The aforesaid first to fourth preferred embodiments of the LED module 100, 100' 100", 200 may be installed on an illuminating lamp. To facilitate the description, an illuminating lamp incorporating the LED module 100 of the first preferred embodiment will be exemplified below.

Figure 21:
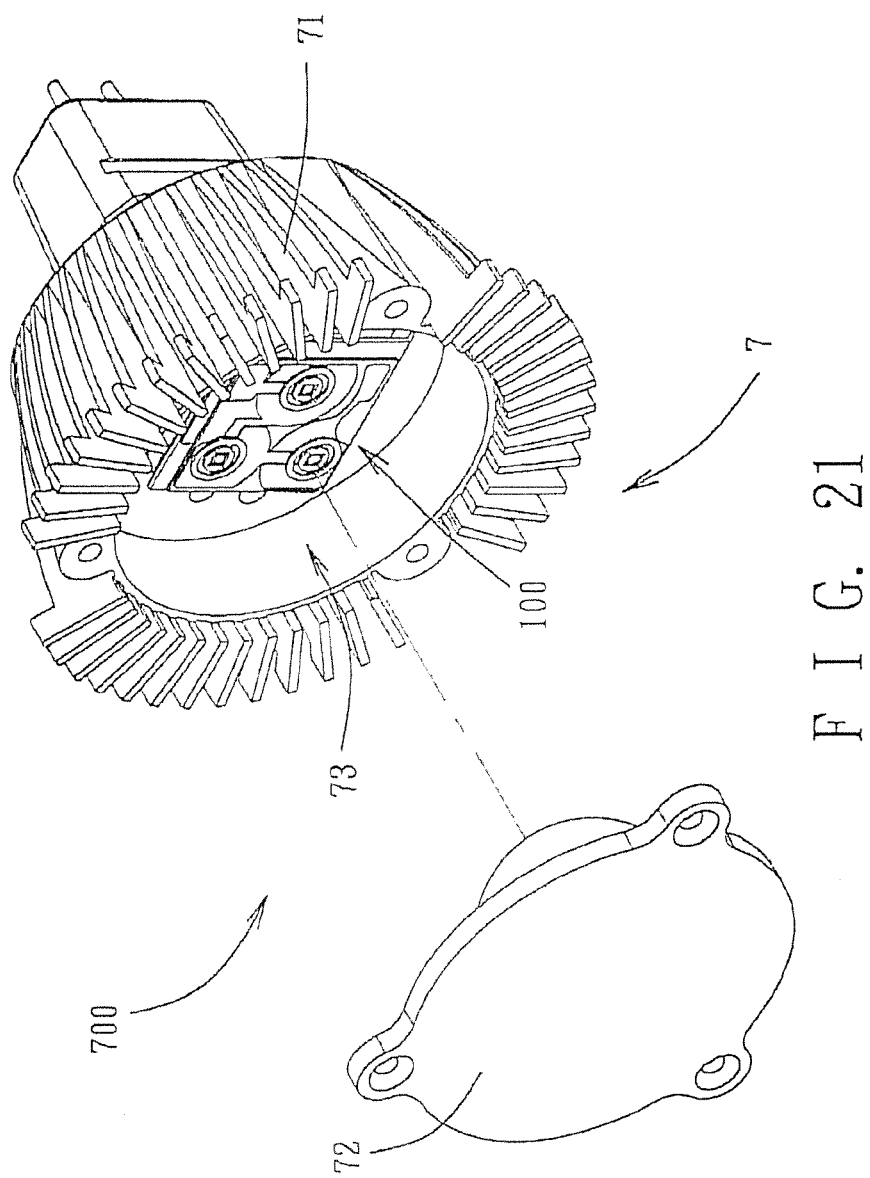
FIG. 21 is a partial exploded perspective view of an LED lamp according to the preferred embodiment of the present invention.

Referring to FIG. 21, an LED lamp 700 according to the preferred embodiment of the present invention comprises a housing 7 and the LED module 100. The housing 7 has a lamp base 71 and a transparent cover 72. The lamp base 71 is concaved, and cooperates with the cover 72 to define a receiving space 73. The LED module 100 is mounted on and is connected electrically to the lamp base 71, and is received within the receiving space 73. The LED module 100 can be illuminated through connection of the lamp base 71 with an external power source. Light emitted by the LED module 100 passes through the cover 72 and out of the housing 7.

From the aforesaid description, through the die-bonding pads 21, 22, 23, 24, 21', 22', 23' of the first patterned conductive layer 2, 2', flexibility is provided with respect to the design of the circuit end the type of chips to be used for the LED module 100, 100', 100", 200 of the present invention.

Further, through soldering of the ceramic and copper layers to form a multi-layer structure, the LED chips 4 can be directly attached to the first patterned conductive layer 2, 2' (Chip-on-Board) to reduce thermal resistant layers and to enhance the effect of heat dissipation. Moreover, through the presence of the chip-receiving hole 313, 313' and the surrounding structure 312 or the ring structure 61, the packaging process can be simplified. Hence, the objects of the present invention can be realized. While the present invention has been described in connection with what are considered the most practical and preferred embodiments, it is understood that this invention is not limited to the disclosed embodiments but is intended to cover various arrangements included within the spirit and scope of the broadest interpretations and equivalent arrangements.

We claim:

1. An LED module, comprising:
    a first dielectric layer;
    a first patterned conductive layer disposed on said first dielectric layer and comprising
        first and second die-bonding pads, each of said first and second die-bonding pads including a pad body and an extension extended from said pad body, said pad body having a die-bonding area and a first cutout extending inwardly from said pad body toward said die-bonding area, wherein said extension of said first die-bonding pad extends into said first cutout of said second die-bonding pad and is proximate to said die-bonding area of said second die-bonding pad, and
        a conductive pad having a conductive body and an extension, said extension of said conductive pad extending from said conductive body into said first cutout of said first die-bonding pad and proximate to said die-bonding area of said first die-bonding pad;
    a second dielectric layer disposed on said first patterned conductive layer and comprising two dielectric members corresponding respectively to said first and second die-bonding pads, each of said dielectric members comprising a chip-receiving hole extending through said second dielectric layer to expose said die-bonding area of a corresponding said die-bonding pad, and a wire-passage hole spaced apart from said chip-receiving hole to expose partially said first patterned conductive layer for wire bonding; and
    two LED chips disposed respectively on die-bonding areas of said first and second die-bonding pads within said chip-receiving holes of said dielectric members, respectively.

2. The LED module of claim 1, wherein said wire-passage hole of each of said dielectric members partially exposes a corresponding one of said extension of one of said first and second die-bonding pads and said extension of said conductive pad that is proximate to a corresponding said die-bonding pad.

3. The LED module of claim 2, wherein each of said dielectric members of said second dielectric layer further comprises a chip-receiving structure, and a surrounding structure spaced apart from said chip-receiving structure, said chip-receiving hole being defined by said chip-receiving structure, said chip-receiving structure and said surrounding structure cooperatively defining said wire-passage hole, said wire-passage hole exposing partially said pad body of one of corresponding said first and second die-bonding pads that is proximate to said die-bonding area thereof and corresponding one of said extensions of said first and second die-bonding pads and said extension of said conductive pad.

4. The LED module of claim 3, wherein at least one of said extensions of said first and second die-bonding pads and said extension of said conductive pad has a constriction part stacked below said surrounding structure of a corresponding said dielectric member, and at least one said pad body of each of said first and second die-bonding pads further comprises a pair of retainers projecting correspondingly toward said constriction part and extended into said first cutout of a corresponding said die-bonding pad.

5. The LED module of claim 2, further comprising a second patterned conductive layer disposed on said second dielectric layer, said second patterned conductive layer including two ring structures disposed on said second dielectric layer corresponding in position to said dielectric members, each of said ring structures surrounding said chip-receiving hole and said wire-passage hole of each said dielectric member and being provided for receiving a lens.

6. The LED module of claim 1, further comprising a metallic layer disposed below said first dielectric layer.

7. The LED module of claim 6, wherein each of said first and second dielectric layers is made of a ceramic material, and each of said first patterned conductive layer and said metallic layer is made of copper.

8. An LED lamp, comprising:
    a housing having a lamp base and a transparent cover cooperatively defining a receiving space; and
    an LED module as claimed in claim 1, said LED module being mounted on and being connected electrically to said lamp base and being received within said receiving space.

9. The LED lamp of claim 8, wherein said LED module further comprises a fluorescent glue disposed within said chip-receiving hole for forming an encapsulant.

10. The LED lamp of claim 8, wherein said LED module further comprises a surrounding structure surrounding said chip-receiving hole, and a packaging resin disposed within said surrounding structure for forming a preformed lens.

* * * * *